(12) United States Patent
Grasso et al.

(10) Patent No.: US 8,975,508 B2
(45) Date of Patent: Mar. 10, 2015

(54) SOLAR CONCENTRATOR FOR PHOTOVOLTAIC SYSTEMS

(75) Inventors: Giorgio Grasso, Milan (IT); Francesco Morichetti, Milan (IT); Silvia Maria Pietralunga, Milan (IT); Aldo Righetti, Milan (IT); Maria Chiara Ubaldi, Milan (IT)

(73) Assignee: Fondazione Centro Internazionale Della Fotonica per Energia, Milan (IT)

( * ) Notice: Subject to any disclaimer, the term of this patent is extended or adjusted under 35 U.S.C. 154(b) by 0 days.

(21) Appl. No.: 14/342,169

(22) PCT Filed: Aug. 22, 2012

(86) PCT No.: PCT/IB2012/054241
§ 371 (c)(1),
(2), (4) Date: Feb. 28, 2014

(87) PCT Pub. No.: WO2013/030720
PCT Pub. Date: Mar. 7, 2013

(65) Prior Publication Data
US 2014/0209148 A1    Jul. 31, 2014

Related U.S. Application Data

(60) Provisional application No. 61/546,460, filed on Oct. 12, 2011.

(30) Foreign Application Priority Data

Sep. 1, 2011  (IT) ................ MI2011A1571

(51) Int. Cl.
  *H01L 31/054*  (2014.01)
  *H01L 31/052*  (2014.01)
(Continued)

(52) U.S. Cl.
  CPC .......... *H01L 31/0525* (2013.01); *F24J 2/062* (2013.01); *F24J 2/12* (2013.01); *H01L 31/0522* (2013.01);
(Continued)

(58) Field of Classification Search
  CPC ..... H01L 31/04–31/06; H01L 27/301–27/304; Y02E 40/47
  USPC .................................................. 136/243–265
  See application file for complete search history.

(56) References Cited

U.S. PATENT DOCUMENTS

| 4,024,852 | A  | * | 5/1977 | L'Esperance et al. ......... | 126/646 |
| 2005/0046977 | A1 | * | 3/2005 | Shifman ....................... | 359/853 |
| 2007/0188876 | A1 |   | 8/2007 | Hines et al. | |

(Continued)

FOREIGN PATENT DOCUMENTS

| AU | 70929 87 A | 10/1987 |
| WO | 2007/084518 A2 | 7/2007 |
| WO | 2009/005621 A1 | 1/2009 |

OTHER PUBLICATIONS

Edmonds I.R., "Prism-coupled compound parabola: a new ideal and optimal solar concentrator", Optics Letters, vol. 11, No. 8, Aug. 1, 1986, pp. 490-492, XP055025313, ISSN: 0146-9592, DOI: 10.1364/OL.11.000490.
(Continued)

*Primary Examiner* — Bach Dinh
(74) *Attorney, Agent, or Firm* — Pearne & Gordon LLP

(57) ABSTRACT

A solar concentrator (1) having a longitudinal axis of extension (3) and a cross-section at right angles to the longitudinal axis substantially equal for a continuum of cross-sections, and comprising a reflective system (6) and a refractive system (7), the reflective system forming an optical inlet (8) and an optical outlet (9) and comprising two semi-portions positioned specularly relative to the plane of symmetry, where the cross-section profile of the refractive system is a triangle (11) having a base (12) at the optical outlet (9) and apex (13) on the axis of symmetry (5), where the cross-section profile of each semi-portion of the reflective system comprises a segment (18) in the shape of a parabola having an axis (20) forming with the axis of symmetry an acceptance angle (θ0) greater than zero and a focus (F) on the axis of symmetry, and where the focus falls inside the triangle.

16 Claims, 7 Drawing Sheets

(51) Int. Cl.
*F24J 2/06* (2006.01)
*F24J 2/12* (2006.01)
*G02B 19/00* (2006.01)
*H01L 31/0232* (2014.01)

(52) U.S. Cl.
CPC ...... *G02B 19/0028* (2013.01); *H01L 31/02327* (2013.01); *Y02E 10/52* (2013.01); *Y02E 10/42* (2013.01)
USPC .......................................... 136/246; 259/256

(56) References Cited

U.S. PATENT DOCUMENTS

2010/0071768 A1 3/2010 Liu
2010/0132753 A1 6/2010 Rosa

OTHER PUBLICATIONS

Edmonds I.R. et al "The Design and Performance of Ideal Solar Concentrators Based on the Prism-Assisted Cylindrical Reflector", Solar Energy, vol. 30, No. 6, 1983, pp. 537-543.

\* cited by examiner

SOLAR CONCENTRATOR FOR PHOTOVOLTAIC SYSTEMS

TECHNICAL FIELD

This invention is applied in the field of photovoltaics, in particular in the field of photovoltaic concentration systems, yet more in particular in the field of low concentration systems.

BACKGROUND ART

There are prior art photovoltaic concentration systems wherein the solar radiation is concentrated using an optical system on the photovoltaic material. The solar concentration factor of the optical concentration systems, defined as the ratio of the area of the inlet opening of the solar radiation and the area occupied by the photovoltaic material on which the radiation is concentrated, may range between values of approximately 1 and 10, which are referred to as low concentration, up to values of 100 and above (high concentration), passing through intermediate values of between approximately 10 and 100 (average concentration).

Patent document AU-A-70929/87 and the article "Prism-coupled compound parabola: a new ideal and optimal solar concentrator", Ian R. Edmonds, OPTICS LETTERS, Vol. 11, No. 8, August 1986, the contents of which are referred to fully in this invention, describe a 2-dimensional (2-D) solar concentrator for low concentration photovoltaics comprising a pair of parabolic reflectors which mirror each other, each parabola, in a cross section at right angles, having an axis parallel to the direction of incidence of the radiation incident at the predetermined angle of acceptance and focus on the apex of a refractive prism positioned between the two reflectors and having base on the optical outlet of the concentrator (at which the photovoltaic cells are positioned). This structure, according of the author of the above-mentioned documents, allows the collection on the photovoltaic cells of all the radiation incident within the angle of acceptance.

The Applicant has found that the prior art solar concentrators, including the above-mentioned concentrator, are not without disadvantages and can be improved from various points of view.

In general, the Applicant has found that prior art solar concentrators are characterised by an unsatisfactory concentration factor and/or concentration efficiency and/or by a large overall size, in particular the height along the axis of symmetry (see below), and/or by a complex production and/or installation and/or maintenance and/or by a high production cost.

In particular, the Applicant has found that the structure of the above-mentioned concentrator described by Edmonds is not in reality optimal in terms of 'concentration efficiency' (Pr), defined as the ratio between the total optical power incident on the optical inlet of the concentrator and the optical power which actually reaches the optical outlet of the concentrator (and, therefore, the photovoltaic cell).

Firstly, the Applicant notes that the above-mentioned prior art 2-dimensional concentrator has a plane of symmetry, a main extension along a longitudinal axis belong to the plane of symmetry and a continuum of cross-sections at right angles to the longitudinal axis between them equal along the entire axis of longitudinal extension, the cross-section of the plane of symmetry defining an axis of symmetry of the right-angled cross-section. In this context, the radiation incident on the concentrator is characterised by two angles of incidence with respect to the axis of symmetry of the cross-section of the concentrator, measured on two planes at right angles to each other, where the first angle (indicated hereafter as $\theta NS$), considered also by Edmonds, is measured on the plane of the cross-section at right angles (on which the above-mentioned parabolas are defined, see, for example, FIG. 1 of the document AU-A-70929/87) and the second angle (indicated as $\theta EO$) is measured on the plane of symmetry of the 2-D concentrator. More precisely, the actual angle of incidence with respect to the axis of symmetry can be projected on the two above-mentioned planes at right angles. For simplicity, the projections will be referred to in this invention with the expression "first and second angle of incidence".

According to Edmonds, the concentration efficiency of the above-mentioned concentrator is equal to one for first angles of incidence $\theta NS$ less than the angle of acceptance. The Applicant found that this statement is strictly true (neglecting the losses due to reflection and refraction) only when the radiation has a direction of incidence which lies on the cross-section plane of the concentrator, or, in other words, the second angle of incidence $\theta EO$, formed with this cross-section plane, is zero.

When, however, the radiation forms a second angle $\theta EO$ with the cross-section plane different from zero, the Applicant has surprisingly discovered that the behaviour of the concentrator differs from that considered by Edmonds (for radiation incident with a first angle $\theta NS$, on the cross-section plane, different from zero), with a reduction in the concentration efficiency which reduces further the greater is the above-mentioned second angle of incidence $\theta EO$ (and the greater is the above-mentioned first angle $\theta NS$).

The Applicant has realised that in a real application of the above-mentioned prior art 2-D concentrator, wherein the latter is oriented with the longitudinal axis of extension (along which the cross-section geometry remains constant) parallel to the East-West geographical direction and with the above-mentioned cross-section at right angles parallel to the North-South geographical direction, the solar radiation over the span of one day varies the relative second angle of incidence ($\theta EO$) up to a maximum ranging from $-90°$ to $+90°$ (with clear horizon). Therefore, according to the Applicant, the overall efficiency over the span of the entire day of the above-mentioned prior art 2-D concentrator would not be as expected, except in the ideal case in which the first angle of incidence $\theta NS$ is zero (concentrator orientated in such a way that the elevation of the axis of symmetry is equal to the elevation of the sun, a condition which may occur at the most only for a few days a year). On the other hand, the overall efficiency would be typically less than that expected.

A problem which forms the basis of this invention, according to its various aspects and/or embodiments, is to provide a solar concentrator for photovoltaics, a photovoltaic system, a photovoltaic panel and a method for producing a photovoltaic panel that can overcome one or more of the above-mentioned disadvantages.

DISCLOSURE OF THE INVENTION

The Applicant found that in the above-mentioned configuration of a solar concentrator for photovoltaics, a significant increase in the concentration efficiency can be obtained by moving the focus to a different position relative to the apex of the refractive prism.

According to one aspect, the invention relates to a solar concentrator for photovoltaics having a plane of symmetry, a main extension along a longitudinal axis belonging to the plane of symmetry and a cross-section at right angles to the longitudinal axis (substantially) equal for a continuum of cross-sections at right angles to the longitudinal axis measured along at least one portion of the longitudinal extension of the concentrator, the cross-section of the plane of symmetry defining an axis of symmetry of the right-angled cross-section. The solar concentrator comprises a main reflective system (hereafter referred to also merely as reflective system) and a secondary refractive system (hereafter referred to also merely as refractive system) both extending longitudinally and having a respective profile on the cross-section at right angles. The main reflective system defines at its two opposite ends respectively along the axis of symmetry an optical inlet and an optical outlet (both positioned substantially at right angles to the axis of symmetry) and comprises two semi-portions positioned specularly relative to the plane of symmetry. The cross-section profile of the refractive system is a triangle having a base at the cross-section of the optical outlet and apex on the axis of symmetry between the optical inlet and outlet. The cross-section profile of each semi-portion of the reflective system extends from a point near a respective vertex to the base of the triangle up to an end point on the optical inlet, and comprises a segment substantially in the shape of a parabola having an axis forming with the axis of symmetry an acceptance angle (indicated with θ0) greater than zero and a focus on the axis of symmetry.

According to one aspect, the focus falls inside the triangle, preferably the distance of the focus from the apex of the triangle is greater than or equal to 5% of the total height of the triangle, more preferably greater than or equal to 7% of the total height of the triangle.

According to the Applicant, the above-mentioned positioning of the focus allows the light radiation to be collected at the base of the triangle (and, therefore, on the photovoltaic cell), when it forms a second angle of incidence θEO different from zero, even significantly greater than the prior art configuration wherein the focus is on the apex of the triangle. Without wishing to link to any interpretative theory, the Applicant believes that when the second angle of incidence is different from zero, the radiation 'sees' a distorted profile of the reflective system (in other words, more 'elongated') with respect to the 'ideal' one on the cross-section at right angles, with consequent reflection outside the focus (in general, higher). The proposed solution is considered to compensate, at least partly, the above-mentioned optical distortion.

According to one aspect, the distance of the focus from the apex of the triangle is less than or equal to 20% of the total height of the triangle, more preferably less than or equal to 15% of the total height of the triangle.

According to one aspect, the triangle is an isosceles triangle.

According to one aspect, the cross-section profile of each semi-portion of the reflective system comprises a first and a second part, preferably joined together without interruption, the first part being preferably (substantially) rectilinear and the second part being the segment substantially shaped according to a parabola.

According to one aspect, the angle at the apex of the triangle (indicated with θv) is greater than or equal to 40°, preferably greater than or equal to 55°.

According to one aspect, the angle at the apex of the triangle is less than or equal to 80°, preferably less than or equal to 65°.

According to one aspect, an angle (hereafter indicated with θ1, meaning the lesser of the two complementary angles which are formed in this way) formed by the first part of the profile of each semi-portion of the reflective system with a direction parallel to the axis of symmetry is between: $\theta1=\pi/2-\theta v/4-\theta 0/2+/-10\%$ (preferably +/−5%).

According to one aspect, the total height of the concentrator along the axis of symmetry is less than or equal to a maximum height corresponding to the configuration wherein the tangent to the second part of the profile of each semi-portion of the reflective system at the end point on the optical inlet is parallel to the axis of symmetry (configuration having the maximum concentration factor). Preferably, the total height is selected in such a way that the corresponding concentration factor is less than or equal to 95% of the maximum concentration factor and/or greater than or equal to 80% (preferably 85%) of the maximum concentration factor.

According to one aspect, the total height of the concentrator is less than or equal to 100 mm, preferably less than or equal to 75 mm.

According to one aspect, the tangent to the second part of the profile of each semi-portion of the reflective system at the connecting point forms an angle (meaning the smaller angle between the two complementary angles formed in this way) with the axis of symmetry equal or almost equal (that is, within a tolerance of +/−5%) to the smaller angle (θ1) formed by the first part of the profile of each semi-portion of the reflective system with the axis of symmetry.

According to one aspect, the ratio (concentration factor) between the area of the optical inlet (or its cross-section width) and the area of the optical outlet (or its cross-section width) is greater than 1, preferably greater than or equal to 2, and/or less than or equal to 10, preferably less than or equal to 8.

According to one aspect, the angle of acceptance is greater than or equal to 5°, preferably greater than or equal to 10° and/or less than or equal to 30°. Advantageously, in this way the concentrator and the relative photovoltaic system have good performance levels throughout the entire year even when installed with the above-mentioned geographical orientation in static mode (that is, fixed) or quasi-static mode (that is, with just a few, for example two, adjustments of the elevation of the axis of symmetry during the year).

According to one aspect, the angle of acceptance is greater than or equal to 15°, preferably greater than or equal to 25° (for a static installation).

According to one aspect, the segment of the profile of each semi-portion of the reflective system substantially in the shape of a parabola comprises three or more rectilinear segments which approximate the shape of an ideal parabola (or rather, a segment of a parabola).

According to one aspect, the refractive system comprises a refractive prism having the above-mentioned triangular profile.

According to one aspect, the secondary refractive system is made of glass or a polymeric material such as Polymethylmethacrylate (PMMA), Polycarbonate, Polyolefin, etc. Preferably, the refractive system is made by injection moulding or by casting or by extrusion. Preferably, the refractive system (the refractive prism) is coated externally with a non-reflective layer (so as to reduce the reflected radiation at the prism/air interface below 1%).

Preferably, the refraction index (n2) of the refractive system is greater than or equal to 1.3, more preferably greater than or equal to approximately 1.5. Preferably, the refraction index (n2) of the refractive system is less than or equal to 2.5.

According to one aspect, the primary reflective system defines an inner compartment housing the secondary refractive system and the portion of the inner compartment left free by the secondary refractive system is filled with air.

According to an alternative aspect, the above-mentioned portion of the inner compartment left free by the secondary refractive system is filled with a dielectric material having refraction index (n1) less than that of the refractive system (prism). Advantageously, in that way the real concentration factor on the plane of the cross-section (first angle θNS) is increased, with the same angle of acceptance and/or the concentration efficiency is increased (following the 'recovery' of the second angle of incidence θEO on the plane of symmetry). For example, defining θin as the desired angle of acceptance, the concentrator can be designed considering an angle formed by the axis of the parabolas with the axis of symmetry equal to θ0=sin−1(sin(θin)/n1) and with an equivalent refraction index of the prism equal to n2/n1. Preferably, the refraction index (n1) of the dielectric material in the above-mentioned portion of the inner compartment is greater than or equal to 1.1. Preferably, the refraction index (n1) of the dielectric material in the above-mentioned portion of the inner compartment is less than or equal to 1.6.

According to one aspect, the cross-section at right angles is (substantially) equal for a continuum of cross-sections along substantially all (with the possible exception of the two longitudinal ends) the longitudinal extension of the concentrator.

According to one aspect, the refractive system comprises a non-linear (or fluorescent) optical material suitable for converting the optical wavelength (thereby increasing the energy conversion efficiency of the sunlight). Preferably, the refractive system comprises polymeric materials dosed with fluorescent material such as organic molecules or nano-particles which are able to absorb two low energy infrared photons emitting one of sum energy (or, normally, greater) which can be absorbed by the photovoltaic cell (up-conversion) and/or absorb a high energy photon emitting two of intermediate energy which can be absorbed by the photovoltaic cell (down-conversion).

According to one aspect, the primary reflective system is made of plastic material (polymeric)) coated with a thin layer (film) of reflective material such as aluminium, silver or their alloys. Preferably, the reflective system is obtained by moulding laminates of plastic material. According to an alternative and preferred aspect, the primary reflective system is a metal sheet suitably shaped and coated with a film of reflective material. The reflectiveness of the reflecting surfaces is preferably greater than 85%, preferably greater than 90%.

According to one aspect, the invention relates to a photovoltaic system comprising the solar concentrator according to any of the aspects or embodiments of this invention and a photovoltaic cell optically coupled with the optical outlet, preferably positioned at the optical outlet, more preferably fixed (for example, with acrylic adhesive with UV reticulation) to a surface of the secondary refractive system (refractive prism) at the base of the triangle.

According to one aspect, the photovoltaic cell is made of silicon, preferably with the ohmic contacts all on the same side ("back contacted"), and/or with the silicon treated on the surface so as to annul the reflected light and widen the absorption spectrum ("black silicon"). Alternatively, the photovoltaic cell is made of Indium Gallium Nitride, and/or of the double or triple joint type, etc.

According to one aspect, the photovoltaic system comprises a metal sheet (for example, made of aluminium or an aluminium alloy), preferably coated as described above, suitably bent so as to form in a single body the main reflective system and forming a bottom wall interposed with structural continuity between the first and second semi-portions of the reflective system, the photovoltaic cell being mechanically fixed to the bottom wall. According to one aspect, the photovoltaic system can comprise a heat dissipater associated with the photovoltaic cell, so as to limit the operating temperature of the cell, and, consequently, keep its conversion efficiency at high levels.

According to one aspect, the invention relates to a photovoltaic solar panel comprising a plurality of photovoltaic systems according to any of the aspects and/or embodiments of this invention, positioned parallel to each other.

According to one aspect, the solar panel comprises a single metal sheet (for example, made of aluminium or an aluminium alloy), preferably coated as described above suitably bent so as to form in a single body the aforementioned plurality of main reflective systems parallel to each other, wherein each (that is, the first and the second) semi-portion of each reflective system (with the exception of those at the transversal ends of the panel) has the end edge at the close optical inlet and in structural continuity (or coincident) with the end edge at the optical inlet of a corresponding (that is, the second and the first, respectively) adjacent semi-portion of an adjacent reflective system, wherein the metal sheet also forms a plurality of bottom walls interposed with structural continuity between each pair of first and second semi-portions belonging to each reflective system, and where the plurality of photovoltaic cells is mechanically fixed to the plurality of bottom walls. Advantageously, such a structure is able to reduce the manufacturing costs, since the metal sheet unifies the functions of mirror, mechanical support of the cells and heat dissipater in a single element.

According to one aspect, the invention relates to a method for making a photovoltaic panel according to the previous paragraph, comprising
preparing a metal sheet, preferably coated as described above;
bending, preferably cold bending, the metal sheet in such a way as to obtain the structure described in the previous paragraph;
fixing, for example, with acrylic adhesive with UV reticulation, the plurality of photovoltaic cells to the plurality of secondary refractive systems;
fixing, for example with an electrically insulating and thermally conductive adhesive, such as a cyanoacrylic adhesive, the plurality of photovoltaic cells (if necessary, each comprising a Printed Circuit Board or PCB) to the plurality of bottom walls.

According to one aspect, the invention relates to a method of installing and/or operating a photovoltaic solar panel according to any of the aspects and/or embodiments of this invention, wherein the panel is oriented in such a way that the plane of symmetry is positioned along the EAST-WEST geographical direction According to one aspect, the above-mentioned installation and/or operation method comprises orienting the panel (preferably only during the installation without further successive orientation activities—'static installation') in such a way that the axis of symmetry has an elevation (angle formed with the horizon) substantially equal to that of the sun on the equinox days.

According to an alternative aspect, the above-mentioned installation and/or operation method comprises orienting the panel twice (preferably, but not exclusively, only twice—'quasi-static installation') during a solar year, wherein the axis of symmetry of the concentrator adopts the first time an elevation (angle formed with the horizon) between (preferably equal to the intermediate value between) the elevation of the sun on the equinox days and the elevation of the sun on the day of the summer solstice, and wherein the axis of symmetry adopts the second time an elevation between (preferably equal to the intermediate value between) the elevation of the sun on the equinox days and the elevation of the sun on the day of the winter solstice. Preferably, the first orientation is performed on a date which falls within a month from the spring equinox and the second orientation is performed on a date which falls within a month from the autumn equinox.

BRIEF DESCRIPTION OF THE DRAWINGS

Other features and advantages will become more apparent from the detailed description below of some embodiments, including non-limiting embodiments, of a solar concentrator for photovoltaics, a photovoltaic system, a photovoltaic panel, a production method and a method of installing and/or operating a photovoltaic solar panel according to this invention. The description is set out below with reference to the accompanying drawings which are provided solely for purposes of illustration without restricting the scope of the invention and in which.

DETAILED DESCRIPTION OF THE PREFERRED EMBODIMENTS OF THE INVENTION

Figure 1:
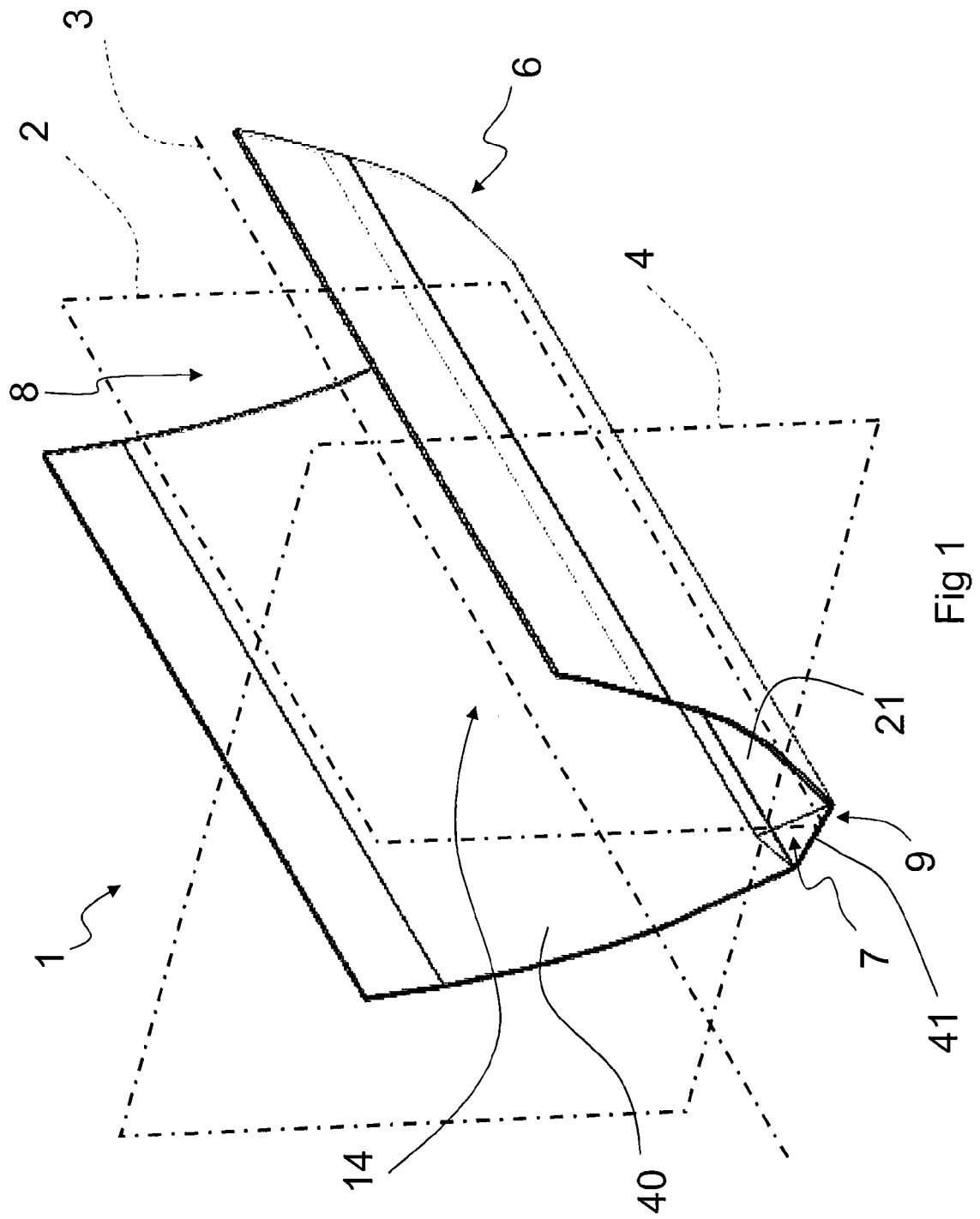
FIG. 1 shows a schematic perspective of a possible embodiment of a solar concentrator according to this invention.

With reference to the accompanying drawings, the reference number 1 denotes in its entirety a solar concentrator for photovoltaics according to this invention, the reference number 10 denotes in its entirety a photovoltaic system according to this invention and the reference number 100 denotes in its entirety a photovoltaic panel according to this invention. In general, the same reference number is used for the same elements (and for the cross-sections) in their embodiment variations.

The solar concentrator 1 typically has a plane of symmetry 2, a main extension along a longitudinal axis 3 belonging to the plane of symmetry and a cross-section through a plane 4 (shown for example, in FIG. 1) at right angles to the longitudinal axis. The cross-section of the plane of symmetry 2 defines an axis of symmetry 5 of the cross-section at right angles.

The term "cross-section" means the result of an intersection of an element, e.g. the concentrator, with a plane, in terms of profiles or 2-dimensional shapes of the components of the element.

As described above, the radiation incident on the concentrator has an actual angle of incidence relative to the angle of symmetry which can be conventionally projected on two planes at right-angles to each other in such a way as to define a first and a second angle of incidence relative to the axis of symmetry, where the first angle of incidence (θNS) is measured on the plane of cross-section 4 and the second angle of incidence (θEO) is measured on the plane of symmetry 2.

The cross-section at right angles of the concentrator is (substantially) equal for a continuum of cross-sections at right angles along at least a portion of the longitudinal extension of the concentrator (preferably a substantial portion, for example a central longitudinal portion extending for at least 75% of the overall longitudinal extension of the concentrator).

Figure 2:
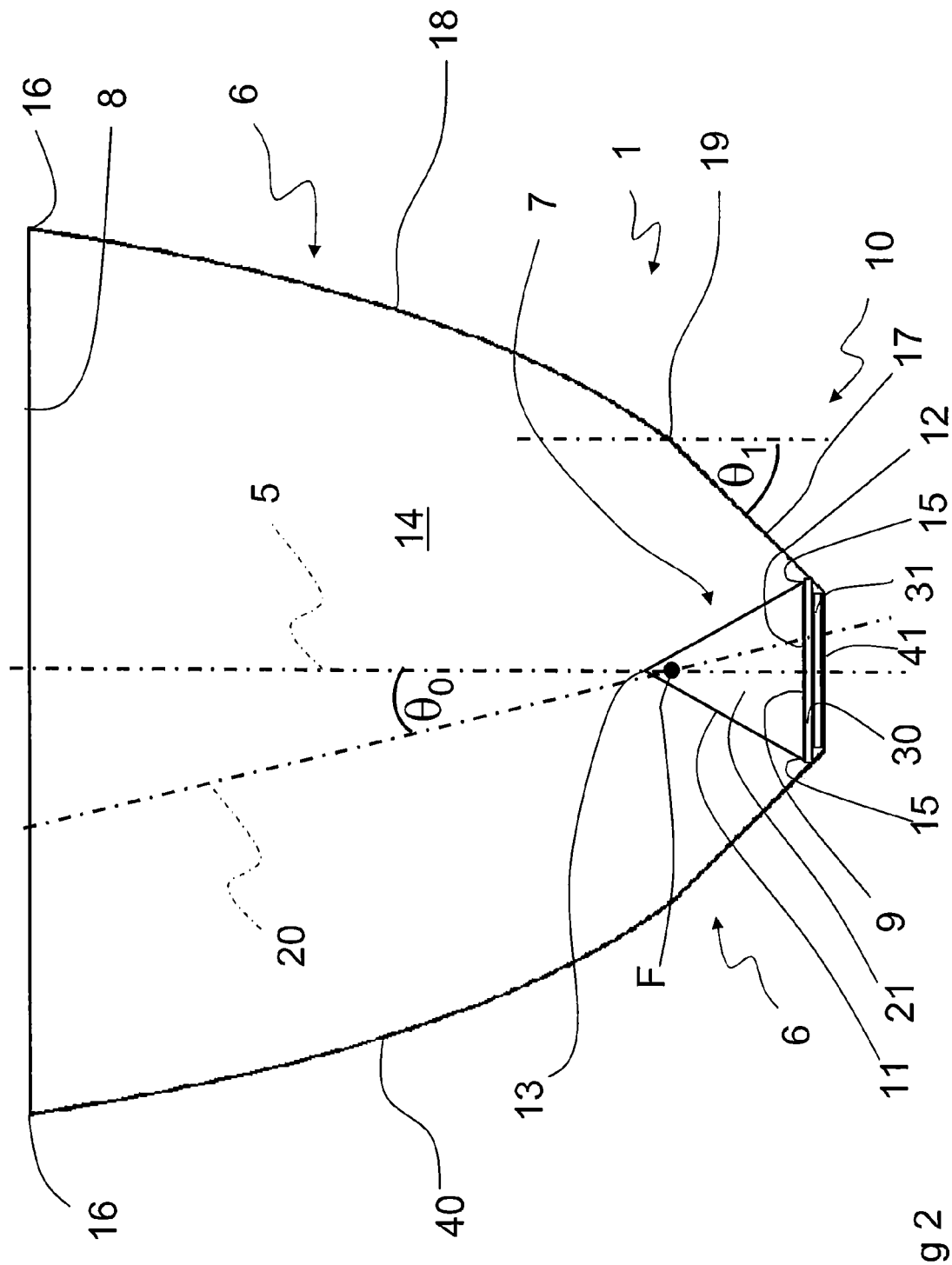
FIG. 2 shows a schematic cross-section at right angles of a photovoltaic system containing the solar concentrator according to this invention.

The solar concentrator comprises a main reflective system 6 and a secondary refractive system 7 both extending longitudinally and having a respective profile on the cross-section at right angles (shown by way of an example in FIG. 2). The main reflective system 6 defines at its two opposite ends respectively along the axis of symmetry an optical inlet 8 and an optical outlet 9 both positioned at right angles to the axis of symmetry 5. The primary reflective system 6 defines an inner compartment 14 (between the optical inlet and outlet) housing the secondary refractive system 7.

Typically, the reflective system 6 comprises two semi-portions positioned specularly relative to the plane of symmetry 2.

Preferably, the cross-section profile of the refractive system 7 is a triangle 11 having a base 12 at the cross-section of the optical outlet 9 and apex 13 on the axis of symmetry 5, between the optical inlet and outlet (that is, in the inner compartment 14).

Preferably, the triangle 11 is an isosceles triangle. For example, the angle of the apex of the triangle (θv) can be equal to 62°.

Preferably, the refractive system comprises a refractive prism 21 having the above-mentioned triangular profile 11. For example, the refraction index (n2) of the prism 21 is equal to 1.49. Preferably, the cross-section profile of each semi-portion 6 of the reflective system extends from a point near the respective vertex 15 to the base of the triangle 11 up to an end point 16 on the optical inlet 8. It comprises a first 17 and a second part 18 joined together without interruption at a connecting point 19, where the first part 17 is rectilinear and the second part 18 is a segment of a parabola having axis 20 forming with the axis of symmetry 5 an angle of acceptance (indicated with θ0) greater than zero and focus F on the axis of symmetry.

Preferably, the focus falls inside the triangle 11. For example, the distance of the focus F from the apex 13 of the triangle 11 is equal to approximately 10% of the total height of the triangle 11 along the axis of symmetry 5.

Even though the drawings show by way of an example the second part of the profile of the semi-portion of the reflective system in the form of an ideal geometrical parabola, this invention also contemplates the case in which the second part comprises several substantially rectilinear segments which approximate a segment of an ideal parabola (for example, three or more substantially rectilinear segments).

Preferably, the smaller angle (θ1) formed by the first part 17 of the profile of each semi-portion of the reflective system 6 with a direction parallel to the axis of symmetry 5 is equal to θ1=π/2−θv/4−θ0/2.

For example, the total height of the concentrator 1 along the axis of symmetry 5 is selected in such a way that the corresponding concentration factor is equal to 90% of the maximum concentration factor corresponding to the configuration wherein the tangent to the second part of the profile of each semi-portion of the reflective system 6 at the end point on the optical inlet 8 is parallel to the axis of symmetry 5.

For example, the total height of the concentrator 1 is equal to 35 mm and the aspect ratio is equal to 1.49.

For example, the concentration factor is equal to approximately 5 or approximately 7.

For example, the portion 14 of the inner compartment left free by the secondary refractive system 7 is filled with air.

Preferably, the optical inlet 8 is closed with a cover made of transparent material, such as PMMA or glass (not shown in FIG. 1).

The photovoltaic system 10 comprises the solar concentrator 1 and a photovoltaic cell 30 optically coupled with the optical outlet 9. More specifically, the photovoltaic cell 30 is preferably positioned at the optical outlet 9, more preferably fixed (for example, with acrylic adhesive with UV reticulation) to a surface of the refractive prism 21 at the base 12 of the triangle 11.

Preferably, the photovoltaic system 10 comprises a metal sheet 40 (for example, made of aluminium or an aluminium alloy), preferably coated with a film of reflective material, suitably bent so as to form in a single body the main reflective system 6. A bottom wall 41 can be so defined and interposed with structural continuity between the first and second semi-portions of the reflective system 6. The photovoltaic cell 30 can be mechanically fixed to the bottom wall 41, if necessary with the interposing of a PCB 31 which is directly fixed (for example, with cyanoacrylic adhesive) to the bottom wall 41.

FIGS. 3a, 3b, 4a, 4b, 5 and 6 show the results of numerical simulations performed with a processing program tracking the rays of sunlight on a mathematical model of a solar concentrator according to this invention (FIGS. 3b, 4b, 5 and 6) and on a mathematical model of a comparative solar concentrator, of the type described in the above-mentioned documents of Ian R. Edmonds (FIGS. 3a, 4a, 5 and 6).

The solar concentrator models according to this invention and for comparison are equal except for the total height of the prism triangle (4 mm and 3.6 mm, respectively), the angle at the apex (62° and 67°, respectively) and the position of the focus of the parabolic cross-sections which no longer coincides with the vertex of the prism, but is positioned 0.4 mm lower due to the effect of the increase in the height of the prism. The remaining design parameters have the values shown above as examples, and also: concentration factor=4.9, angle of acceptance=14°, n2=1.5, height (from the optical inlet to the optical outlet)=35 mm, width at the base of the triangle 4.8 mm.

The first angle of incidence is equal to 14° for FIGS. 3a, 3b, 4a, 4b and 5.

Figure 3A:
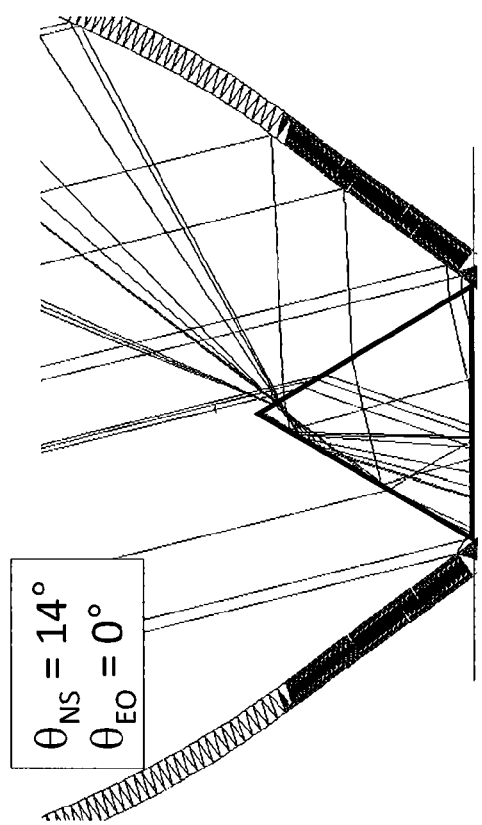
FIGS. 3a and 3b show respectively comparative schematic and partial cross-sections at right angles of a solar concentrator according to this invention, showing the paths of the rays of the light radiation calculated numerically for a value of the first θNS and second angle of incidence θEO equal, respectively, to 14° and 0°.
Figure 3B:
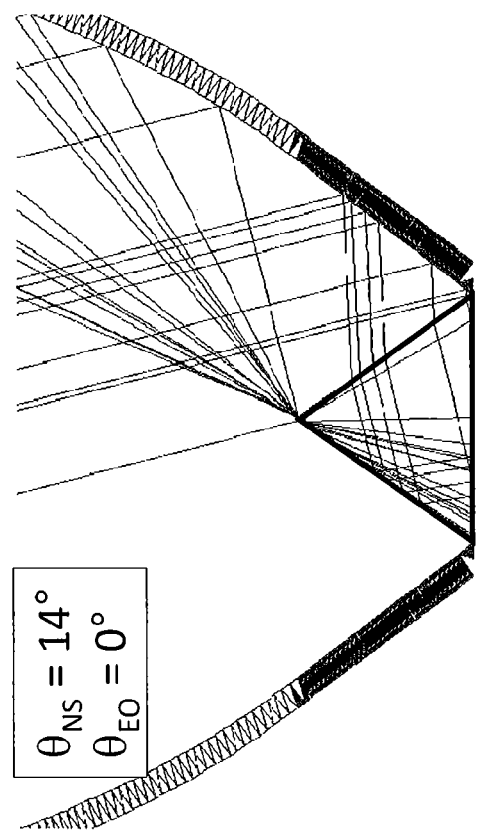
Figure 4A:
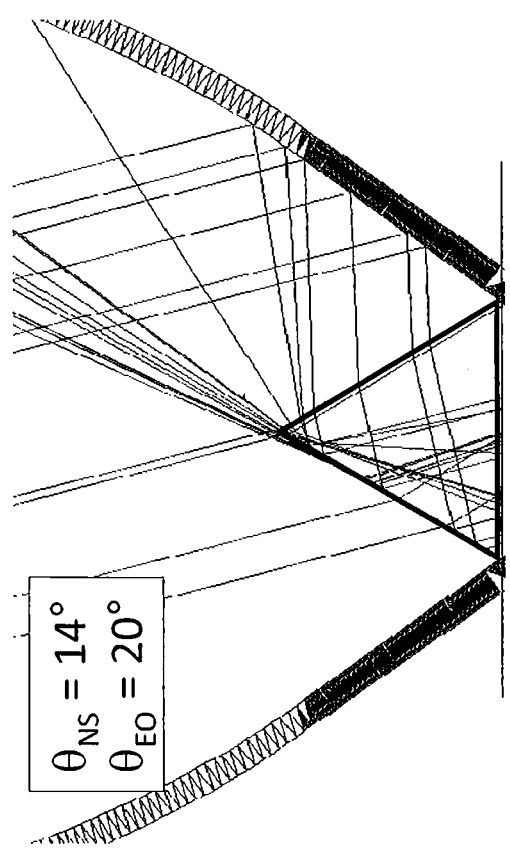
FIGS. 4a and 4b show respectively comparative schematic and partial cross-sections at right angles of a solar concentrator according to this invention, showing the projections on the cross-section of the paths of the rays of the light radiation calculated numerically for a value of the first θNS and second angle of incidence θEO equal, respectively, to 14° and 20°.
Figure 4B:
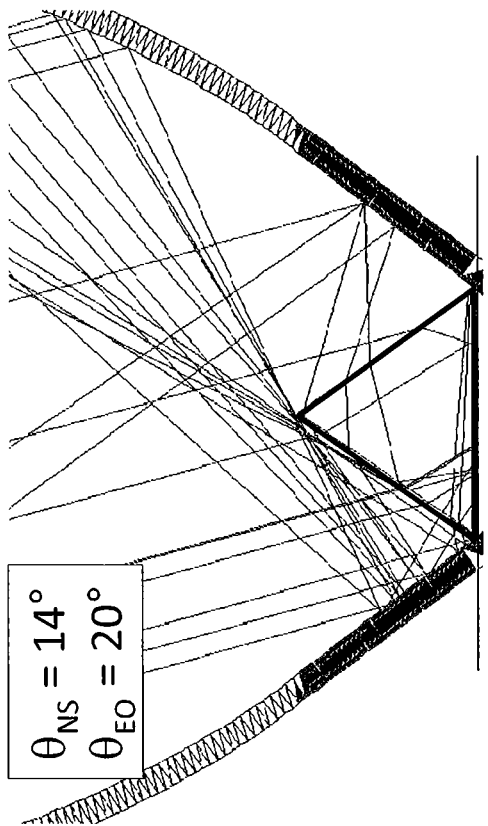

The second angle of incidence is equal to 0° for FIGS. 3a and 3b and equal to 20° for FIGS. 4a and 4b.

FIGS. 3a and 3b show how for a second angle of incidence equal to 0°, both the concentrators act in an equivalent manner.

FIGS. 4a and 4b show, on the other hand, how for a second angle of incidence different to 0°, the concentrator according to this invention has a better performance than the comparative concentrator in terms of radiation concentration capacity on the base of the triangle.

Figure 5:
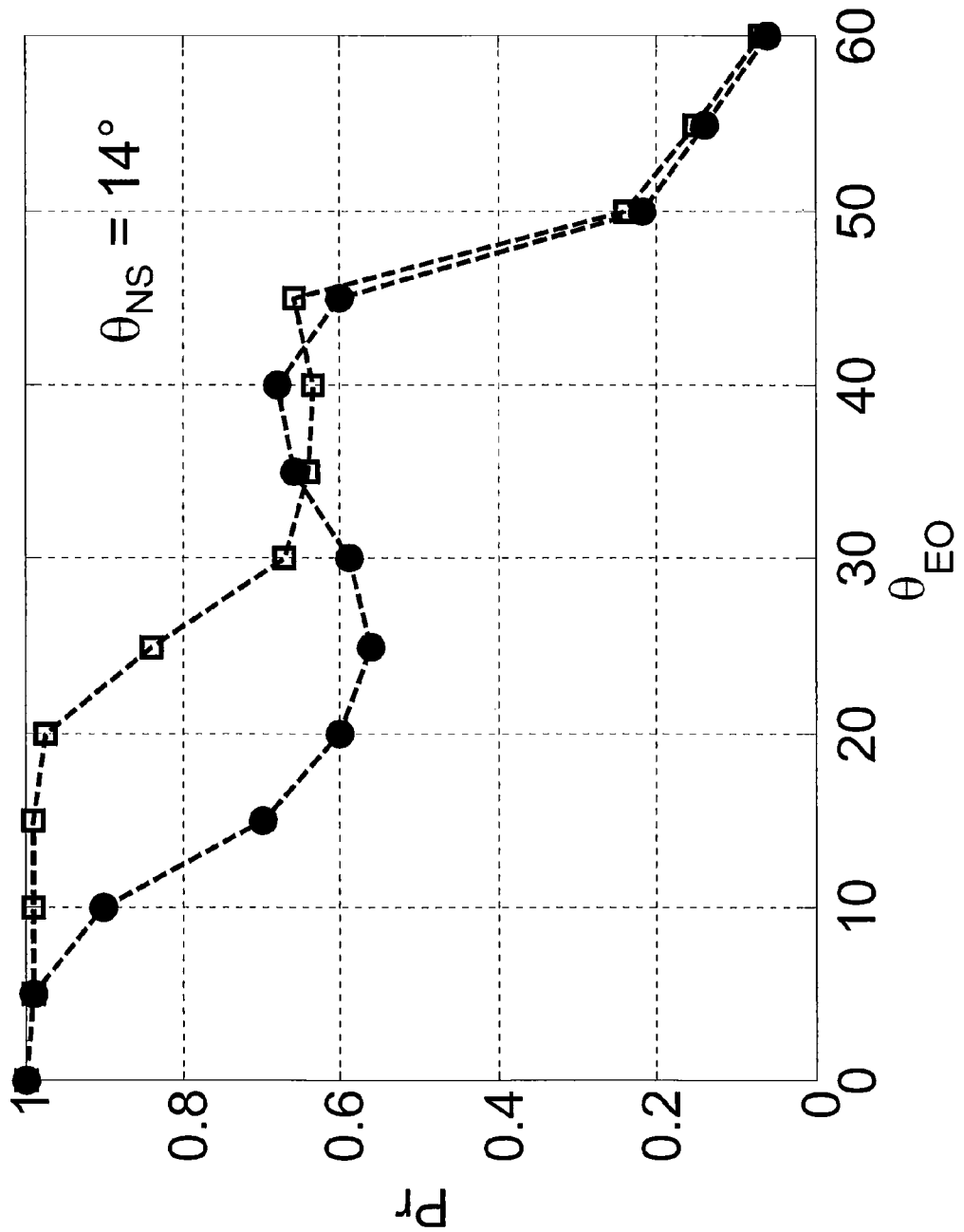
FIG. 5 shows the results of a numerical calculation of the concentration efficiency of a solar concentrator according to this invention and a comparison for various second angles of incidence (and with first angle of incidence equal to 14°)

FIG. 5 shows the concentration efficiency Pr (vertical axis) of the two concentrators for various values of the second angle of incidence (horizontal axis). The line with the circles corresponds to the comparative concentrator model and the line with the squares corresponds to the concentrator model according to this invention.

Figure 6:
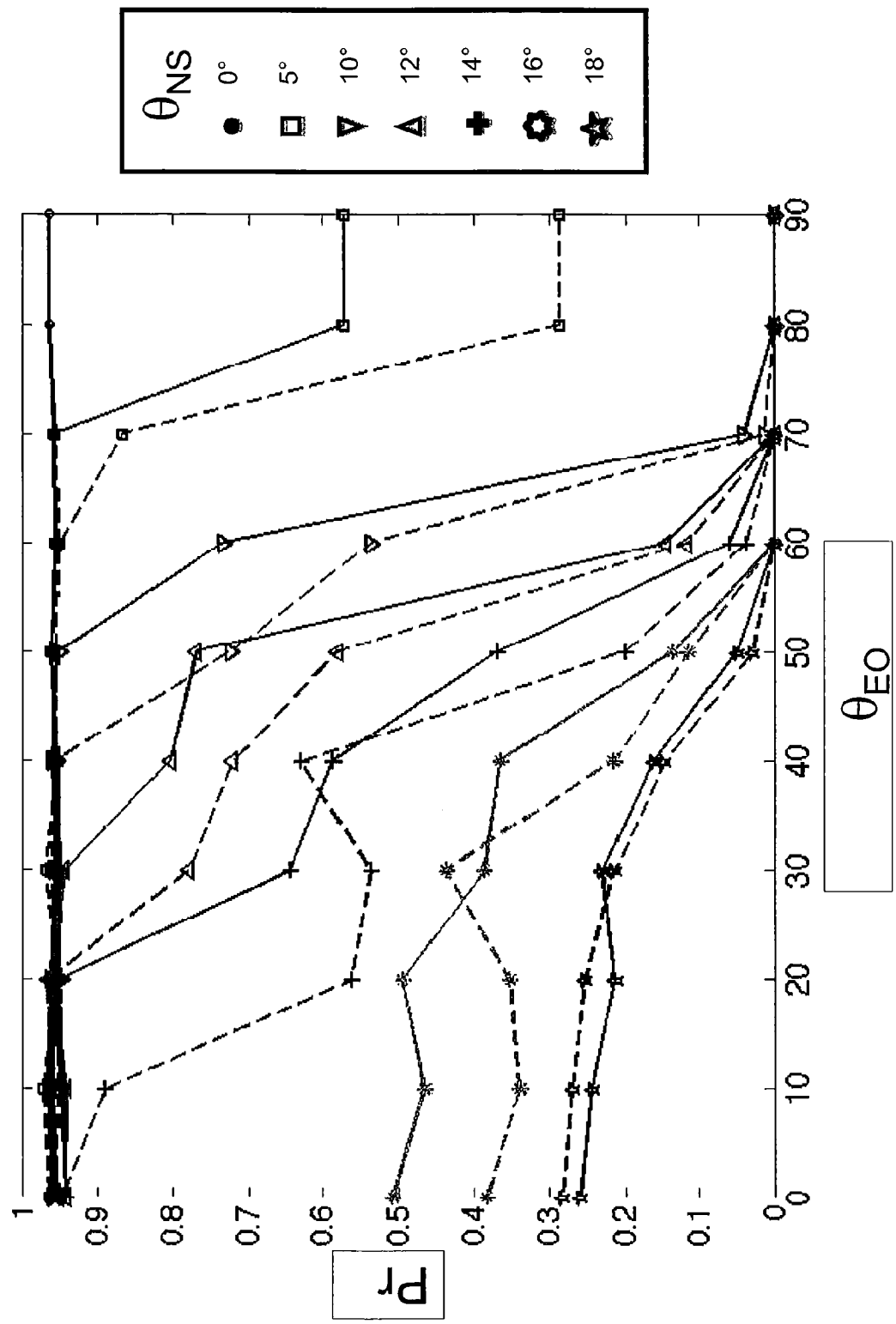
FIG. 6 shows the results of a numerical calculation of the concentration efficiency of a solar concentrator according to this invention and a comparison for various first and second angles of incidence.

FIG. 6 shows in more detail the concentration efficiency Pr (vertical axis) of the two concentrators for various values of the second angle of incidence (horizontal axis) and for various values of the first angle of incidence (according to the legend in the figure). The dashed lines correspond to the comparative concentrator model and the continuous lines correspond to the concentrator model according to this invention.

FIGS. 5 and 6 show that the concentrator according to the invention has a better performance than the comparative concentrator in terms of concentration efficiency, for almost every value of the first and second angle of incidence. In other words, the concentrator according to this invention has a better overall concentration efficiency.

According to an alternative embodiment, the portion of the inner compartment 14 left free by the secondary refractive system 7 is filled with a dielectric material having a refraction index less than that of the refractive system (prism). For example, the refraction index (n1) of the dielectric material (for example, PMMA) in the above-mentioned portion of the inner compartment 14 is equal to 1.49 whilst the refraction index n2 of the component material of the prism (for example, lanthanum glass) is equal to 1.9.

In the embodiment shown by way of an example in FIG. 1, the cross-section at right angles is (substantially) equal for a continuum of cross-sections along substantially all (with the exception of the two longitudinal ends) the longitudinal extension of the concentrator. Preferably, each of the two longitudinal ends of the concentrator 1 is closed by a respective flat wall (not shown in FIG. 1), preferably having a reflective surface facing towards the inner compartment 14 (or, alternatively, a transparent wall).

Figure 7:
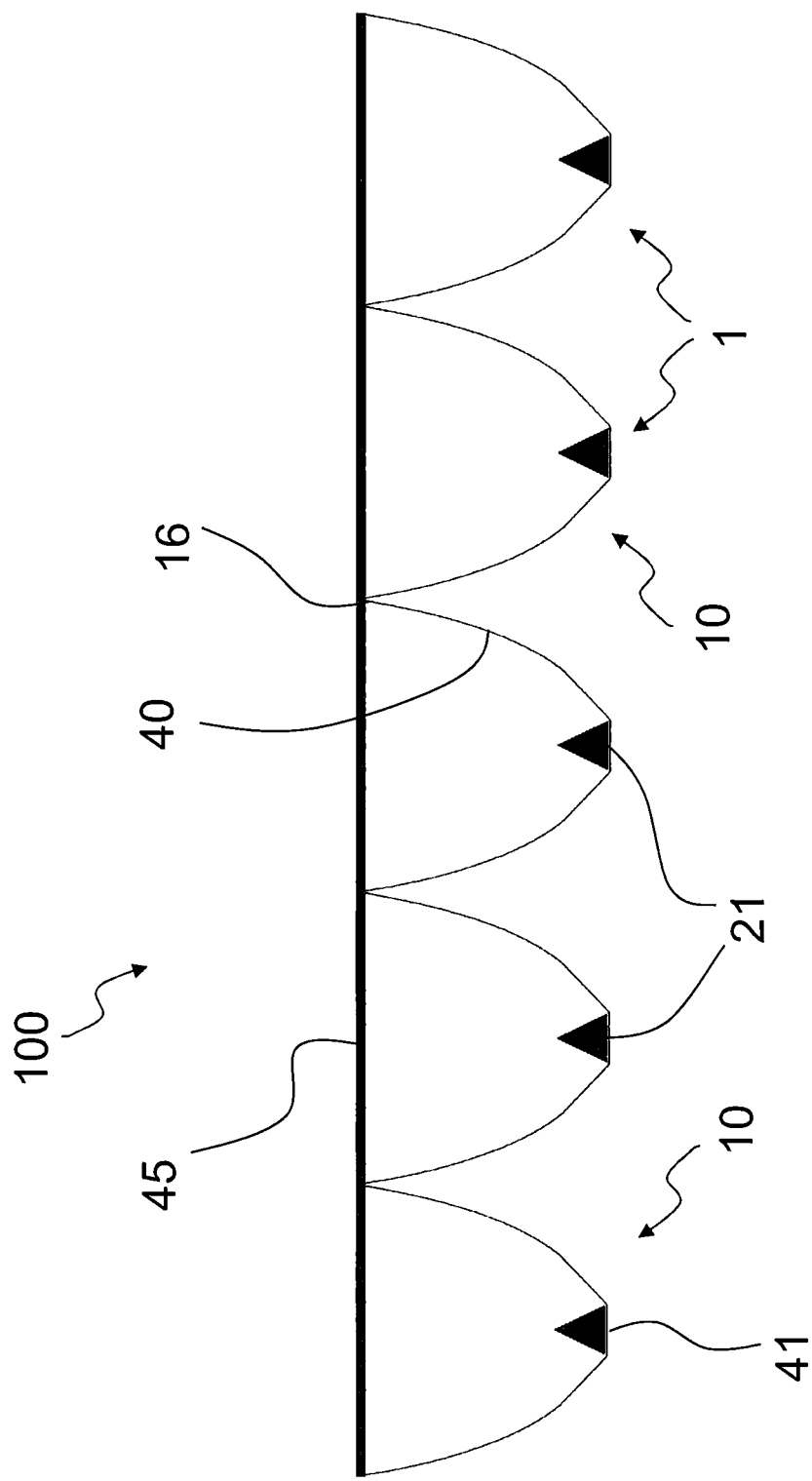
FIG. 7 shows a schematic cross-section at right angles of a photovoltaic solar panel according to this invention.

In an alternative embodiment (not shown), in particular in the case of the solution described above with two materials with refraction indices n1 and n2, the concentrator 1 can be made with a suitable shaping of the relative longitudinal ends, for example to obtain solar concentration in both directions (3D concentrator). FIG. 7 shows the schematic cross-section at right angles of an example solar panel 100 comprising a plurality of photovoltaic systems 10 as described above by way of an example, positioned parallel to each other.

The solar panel 100 comprises a single metal sheet 40 (for example, made of aluminium or an aluminium alloy), preferably coated as described above, suitably bent so as to form in a single body the aforementioned plurality of main reflective systems parallel to each other, wherein each (that is, the first and the second) semi-portion of each reflective system (with the exception of those at the transversal ends of the panel) has the end edge 16 at the optical inlet coinciding with the end edge at the optical inlet of a corresponding (that is, the second and the first, respectively) adjacent semi-portion of an adjacent reflective system.

The metal sheet 40 also preferably forms a plurality of bottom walls 41 interposed with structural continuity between each pair of first and second semi-portions belonging to each reflective system. Each photovoltaic cell (not visible in the figure) is mechanically fixed to a respective bottom wall 41, as described above. A respective secondary refractive system, for example a prism 21, is positioned above each photovoltaic cell.

Preferably, a single cover 45 made of transparent material, such as PMMA or glass, closes all the optical inlets.

The solar panel 100 described above with reference to FIG. 10 can be produced according to the following steps:
preparing a metal sheet 40, preferably coated as described above;

bending, preferably cold bending, the metal sheet 40 in such a way as to obtain the structure described above;

fixing, for example, with acrylic adhesive with UV reticulation, the plurality of photovoltaic cells 30 to the plurality of secondary refractive systems 7, 21;

fixing, for example, with cyanoacrylic adhesive, the plurality of photovoltaic cells to the plurality of bottom walls 41;

The Applicant has made a prototype of a photovoltaic system according to this invention by cold bending an aluminium sheet (thickness 0.5 mm) covered with a film of Silver and Aluminium alloy and coated with a protective, nanostructured dielectric material (reflectiveness approximately 95%). The prism is made of PMMA with optically polished surfaces. The photovoltaic cells are made from back-contact monocrystalline silicon cells, produced by Sunpower, cut by laser cutting into 4.8×100 mm cells and soldered on a specifically designed PCB. The coupling between the cell and the prism was performed using an acrylic adhesive with UV reticulation, whilst the gluing between the PCB and the sheet was performed using a normal cyanoacrylic adhesive.

The design parameters of the prototype (including the geometrical dimensions) are those shown above (for example, geometrical gain 4.9, height of concentrator 35 mm, isosceles prism with base width 4.8 mm—like the photovoltaic cell—and height 4 mm, focus of parabolic cross-sections 0.4 mm below the apex of the prism).

The invention claimed is:

1. A solar concentrator for photovoltaic systems having a plane of symmetry, one main extension along a longitudinal axis belonging to the plane of symmetry and a cross-section at right angles to the longitudinal axis substantially equal for a continuum of right-angled cross-sections along at least a portion of a longitudinal extension of the concentrator, a cross-section of the plane of symmetry forming an axis of symmetry of the right-angled cross section, the solar concentrator comprising a main reflective system and a secondary refractive system both extending longitudinally and having a respective profile on the right-angled cross-section, the main reflective system forming at its two opposite ends along the axis of symmetry respectively an optical inlet and an optical outlet and comprising two semi-portions positioned specularly relative to the plane of symmetry, wherein a cross-section profile of the secondary refractive system is a triangle having a base at a cross-section of the optical outlet and apex on the axis of symmetry between the optical inlet and outlet, wherein a cross-section profile of each semi-portion of the main reflective system extends from a point near a respective vertex to the base of the triangle up to an end point on the optical inlet and comprises a segment substantially in the shape of a parabola having an axis forming with the axis of symmetry an acceptance angle greater than zero and a focus on the axis of symmetry, and wherein the focus falls inside the triangle.

2. The solar concentrator according to claim 1, wherein the distance of the focus from the apex of the triangle is greater than, or equal to, 5% of the total height of the triangle.

3. The solar concentrator according to claim 2, wherein the distance of the focus from the apex of the triangle is less than, or equal to, 20% of the total height of the triangle.

4. The solar concentrator according to claim 2, wherein the triangle is an isosceles triangle and the angle of the apex of the triangle is greater than, or equal to, 40°.

5. The solar concentrator according to claim 2, wherein the cross-section profile of each semi-portion of the main reflective system comprises a first and a second part, the first part being substantially rectilinear and the second part consisting in the segment substantially shaped according to a parabola.

6. The solar concentrator according to claim 1, wherein the distance of the focus from the apex of the triangle is less than, or equal to, 20% of the total height of the triangle.

7. The solar concentrator according to claim 6, wherein the triangle is an isosceles triangle and the angle of the apex of the triangle is greater than, or equal to, 40°.

8. The solar concentrator according to claim 6, wherein the cross-section profile of each semi-portion of the main reflective system comprises a first and a second part, the first part being substantially rectilinear and the second part consisting in the segment substantially shaped according to a parabola.

9. The solar concentrator according to claim 1, wherein the triangle is an isosceles triangle and the angle of the apex of the triangle is greater than, or equal to, 40°.

10. The solar concentrator according to claim 1, wherein the cross-section profile of each semi-portion of the main reflective system comprises a first and a second part, the first part being substantially rectilinear and the second part consisting in the segment substantially shaped according to a parabola.

11. The solar concentrator according to claim 10, wherein an angle formed by the first part of the profile of each semi-portion of the main reflective system with a direction parallel to the axis of symmetry is comprised between $\pi/2-\theta_v/4-\theta_0/2-0.1*(\pi/2-\theta_v/4-\theta_0/2)$ and $\pi/2-\theta_v/4-\theta_0/2+0.1*(\pi/2-\theta_v/4-\theta_0/2)$, wherein $\theta_v$ is the angle of the apex of the triangle and $\theta_0$ is said acceptance angle.

12. The solar concentrator according to claim 10, wherein the first and second part are joined together without interruption.

13. The solar concentrator according to claim 1, wherein the triangle is an isosceles triangle and the angle of the apex of the triangle is less than, or equal to, 80°.

14. A photovoltaic system comprising a solar concentrator according to claim 1 and a photovoltaic cell optically coupled with the optical outlet.

15. The photovoltaic system according to claim 14, comprising a metal sheet suitably bent so as to form in a single body the main reflective system and also forming a bottom wall interposed with structural continuity between the first and second semi-portions of the main reflective system, the photovoltaic cell being mechanically fixed to the bottom wall.

16. A photovoltaic solar panel comprising a plurality of photovoltaic systems each one comprising a solar concentrator according to claim 1 and a photovoltaic cell optically coupled with the optical outlet, the photovoltaic systems being positioned with the longitudinal axes parallel to each other, wherein the photovoltaic solar panel comprises a single metal sheet suitably bent so as to form in a single body the aforementioned plurality of main reflective systems parallel to each other, wherein each semi-portion of each main reflective system has the end edge at the close optical inlet and in structural continuity with the end edge at the optical inlet of a corresponding adjacent semi-portion of an adjacent main reflective system, wherein the metal sheet also forms a plurality of bottom walls interposed with structural continuity between each pair of first and second semi-portions belonging to each main reflective system, and wherein the plurality of photovoltaic cells is mechanically fixed to the plurality of bottom walls.

* * * * *